United States Patent [19]

Suter

[11] Patent Number: 4,978,930
[45] Date of Patent: Dec. 18, 1990

[54] LOW VOLTAGE VCO TEMPERATURE COMPENSATION

[75] Inventor: Richard R. Suter, Beaverton, Oreg.

[73] Assignee: AT&E Corporation, San Francisco, Calif.

[21] Appl. No.: 381,436

[22] Filed: Jul. 18, 1989

[51] Int. Cl.[5] ............................ H03B 5/04; H03L 1/02
[52] U.S. Cl. ........................................ 331/176; 331/66; 331/177 V
[58] Field of Search ................... 331/36 C, 66, 108 C, 331/116 R, 116 F, 116 E, 117 R, 117 F, 117 E, 176, 177 V

[56] References Cited

U.S. PATENT DOCUMENTS

| | | | |
|---|---|---|---|
| 4,063,194 | 12/1977 | Helle | 331/177 V X |
| 4,156,210 | 5/1979 | Lipke | 331/114 |
| 4,412,188 | 10/1983 | Helle et al. | 331/66 X |
| 4,751,475 | 6/1988 | Kubo et al. | 331/177 V X |
| 4,833,426 | 5/1989 | Robichon et al. | 331/116 R X |

Primary Examiner—David Mis
Attorney, Agent, or Firm—Elmer W. Galbi

[57] ABSTRACT

A circuit for temperature compensation of a varactor voltage controlled oscillator control signal includes a proportional to absolute temperature (PTAT) current source and an adjustable, temperature stable current source. The difference between these two current sources defines an offset current. The varactor control signal voltage is shifted by a predetermined reference voltage and offset by an offset voltage proportional to the offset current, in a differential amplifier portion of the circuit, to provide a tuning signal for controlling the varactor so as to compensate for the varactor capacitance temperature drift. The adjustable, temperature stable current source allows tuning the circuit in order to precisely tune the VCO to a desired frequency under a predetermined set of operating conditions in order to correct component and process variations.

12 Claims, 1 Drawing Sheet

LOW VOLTAGE VCO TEMPERATURE COMPENSATION

BACKGROUND OF THE INVENTION

The present invention relates to the field of varactor voltage-controlled oscillator (VCO) circuits and, in particular, pertains to techniques for compensating for the temperature dependence of varactor capacitance.

Varactors, also known as a tuning diodes, have gained popularity for application as voltage-variable capacitors in building VCO circuits. Typically, a VCO circuit includes an LC tank circuit on the input of an oscillator. The capacitive element in the tank circuit may be a varactor. The oscillator frequency is:

$$\frac{1}{2\pi \sqrt{LC_{VT}}}$$

where $C_{vt}$ is the series equivalent capacitance of the varactor.

Varactor capacitance consists primarily of the junction capacitance of a reverse biased PN junction. Accordingly, the capacitance of these devices varies inversely with the applied reverse bias voltage. Therefore, the frequency of the tank circuit, and hence the oscillator frequency, may be adjusted by varying the reverse bias voltage on the varactor.

The varactor has a capacitance of approximately:

$$\frac{C_D}{(V + \phi)^\gamma}$$

where V is the reverse bias voltage across the varactor, phi is the junction contact potential (typically 0.74 volts for silicone at room temperature) and gamma is the capacitance exponent, a function of the doping profile of the varactor device. $C_D$ equals $=C_0$ where $C_0$ is the capacitance of the varactor at 0 bias voltage. Phi is a strong function of temperature, for example $-2$ millivolts per degree C. As a result, the varactor device capacitance drifts substantially over temperature.

Additionally, as indicated in the above equation, the capacitance drift is an inverse function of applied bias voltage. For low bias levels, for example one or two volts, the capacitance drift is as high as $+600$ parts per million per degree centigrade (PPM/degree C). This represents an oscillator frequency change of $-300$ PPM per degree C which, at 10 megahertz, means a frequency shift of 3 kilohertz per degree C. Accordingly, a temperature compensation scheme is desirable for any frequency control not using feedback techniques such as a phase locked loop. Temperature compensation is especially important in low bias level applications as the varactor capacitance drift is most pronounced.

The prior art discloses a temperature compensating network for a varactor control signal $V_{in}$. The network comprises a forward biased diode in series with the varactor control signal $V_{in}$ and a bias resistor between the varactor cathode and circuit ground. In operation, an increase in temperature results in a decrease of the forward diode voltage $V_{diode}$. If the control signal voltage $V_{in}$ is constant, the output voltage to the varactor will rise, lowering the capacitance of the varactor, and thereby partially offset the initial capacitance increase caused by the temperature change.

The temperature compensating method described above is impractical in a circuit that operates on a low power supply voltage because of the forward diode voltage drop, typically 0.7 volts at room temperature. For example, in a miniaturized portable FM receiver, the total power supply voltage may be only three volts. Applying the diode drop compensation technique would effectively sacrifice over 23 percent of the potential control voltage swing. Accordingly, the need remains for temperature compensation of a varactor VCO while maintaining voltage swing of the varactor control signal.

SUMMARY OF THE INVENTION

An object of the invention is to compensate for temperature drift in a varactor voltage-controlled oscillator without sacrificing voltage swing of the control signal.

The invention provides a method of temperature compensating a control signal for controlling a varactor voltage-controlled oscillator. The method includes providing a temperature dependent offset current; offsetting the control signal voltage by an amount proportional to the offset current to form a tuning signal having a temperature dependent voltage; and, varying the offset current in response to temperature so that the tuning signal voltage varies to compensate for the oscillator temperature drift. The tuning signal is amplified such that it has a voltage swing substantially equal to the power supply voltage.

The step of providing an offset current preferably includes providing a current proportional to temperature (a PTAT current) providing a temperature stable current; and subtracting the PTAT current from the temperature stable current to form the offset current. As a result of these steps, the offset current is inversely proportional to temperature.

The method may further include adjusting the temperature stable current to tune the oscillator to a predetermined frequency under a predetermined set of operating conditions.

To provide the offset current with temperature dependence similar to a PN junction, the method includes providing a temperature stable voltage source; providing an NPN bipolar transistor having a base terminal, an emitter terminal and a collector terminal; coupling the emitter terminal to circuit ground through a predetermined resistance; coupling the voltage source to the base terminal to forward bias the transistor to induce a temperature dependent collector current; and mirroring the collector current.

Another aspect of the invention is a circuit for adjusting a varactor control signal voltage to compensate for the capacitance temperature drift of a varactor. The circuit comprises an input terminal for receiving the control signal, an offset current source for providing an offset current having a temperature drift proportional to the varactor capacitance temperature drift, and circuitry for converting the offset current to an offset signal having a voltage proportional to the offset current.

The offset current source includes a PTAT current source and an adjustable, stable current source. The PTAT current source comprises a band gap voltage source for providing a temperature stable voltage signal, a transistor forward biased by the stable voltage signal to provide a PTAT current and current mirror circuitry for mirroring the PTAT current to provide a current proportional to the PTAT current. The temperature stable current source is adjustable to allow adjusting the varactor capacitance under a predetermined set of operating conditions to tune the oscillator.

The circuit also includes a reference voltage source for providing a predetermined reference voltage. A differential amplifier circuit is arranged for shifting the control signal voltage by an amount equal to the reference voltage and combining the shifted control signal voltage and the offset signal voltage to form a tuning signal. Therefore, in operation, the tuning signal voltage will be proportional to the difference between the reference signal voltage and the control signal voltage, offset by the offset voltage.

The compensation circuit preferably is implemented in a bipolar integrated circuit. Such an integrated circuit comprises an input terminal for receiving the control signal having a voltage related to a predetermined reference voltage; a band gap voltage source for providing a temperature stable voltage; a PTAT current source coupled to the band gap voltage source for providing a PTAT offset current; and, a reference voltage source for providing such a predetermined reference voltage.

Additionally, a differential amplifier is provided having an inverting input node, a non-inverting input node and an output node. An input resistor is coupled between the input means and the inverting input node. The reference voltage source is coupled to the noninverting input node. The PTAT current source is coupled to the inverting input node. A feedback resistor is coupled between the output node and the inverting input node to set a predetermined gain of the amplifier. Finally, output circuitry couples the output node to the oscillator to provide a tuning signal.

A temperature stable current source may also be coupled to the inverting input node for providing a stable current. In that case, in operation, the offset voltage will be proportional to the difference between the offset current and the stable current. Preferably, the temperature stable current source is adjustable for adjusting the temperature stable current to tune the oscillator.

The foregoing and other objects, features and advantages of the invention will become more readily apparent from the following detailed description of a preferred embodiment which proceeds with reference to the drawing.

DETAILED DESCRIPTION OF THE PREFERRED EMBODIMENT

Figure 1:
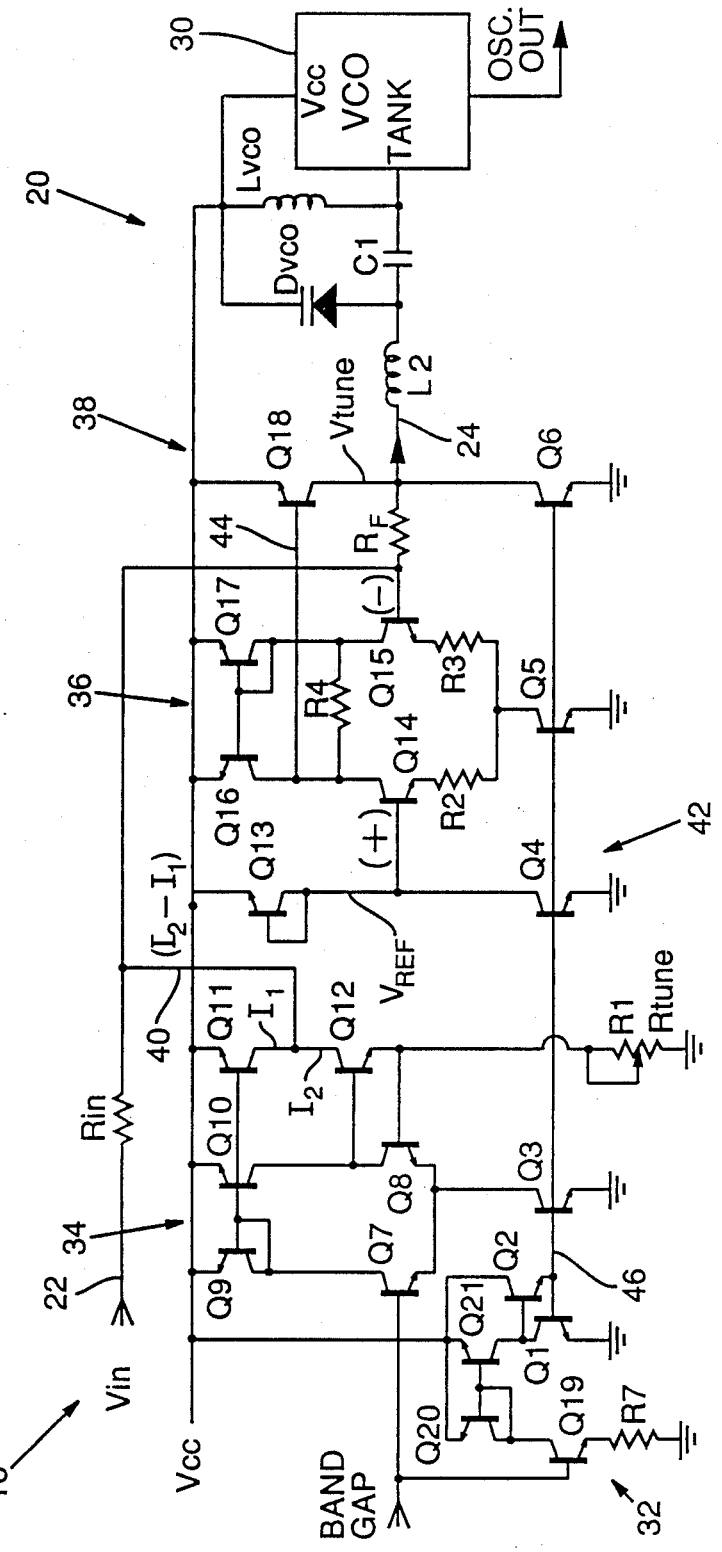
FIG. 1 is a schematic diagram of a varactor VCO circuit including temperature compensation according to the present invention.

FIG. 1 includes a compensation circuit 10 and a voltage-controlled oscillator (VCO) circuit. The VCO circuit includes an LC tank circuit 20 coupled to a VCO amplifier 30 such that the tank circuit controls the VCO frequency. The tank circuit 20 consists essentially of an inductor $L_{vco}$ and a varactor $D_{vco}$. A capacitor C1 prevents the inductor from shorting the varactor bias voltage. The inductance of $L_{vco}$ is assumed constant for present purposes, so the tank circuit resonant frequency, and hence the VCO frequency, vary with the capacitance of the varactor $D_{vco}$.

A control signal $V_{in}$ is provided to the compensation circuit 10 along a conductor 22 for controlling the VCO frequency. The control signal is assumed to have a voltage related to a fixed control reference voltage. In other words, the control signal voltage equals the control reference voltage plus an error or correction component. In general, the compensation circuit 10 level shifts the control signal voltage by the control reference voltage to yield an error signal having a voltage proportional to the error component, adjusts the error signal voltage to compensate for capacitance drift of the varactor, and couples a resulting tuning signal $V_{tune}$ to the tank circuit 20 to control the VCO as more fully described below.

The tuning signal $V_{tune}$ is coupled to the VCO via an inductor L2 along a path 24. Inductor L2 decouples from the bias circuit at the oscillation frequency. The capacitance temperature drift of $D_{vco}$ is substantially corrected by adjusting the tuning signal voltage $V_{tune}$ because $V_{tune}$ determines the reverse bias voltage on the varactor.

Temperature compensation circuit 10 includes a proportional to absolute temperature (PTAT) current source 32 for providing a PTAT current $I_1$, a temperature stable, adjustable current source 34 for providing a stable current $I_2$, a voltage source 42 for providing a predetermined reference voltage $V_{ref}$, an amplifier 36, and an output driver stage 38 for providing the tuning signal $V_{tune}$ to the VCO. The PTAT current and the stable current are combined to form an offset current. The amplifier 36 is arranged to combine these currents and voltages to form a signal having a voltage proportional to the difference between $V_{in}$ and $V_{ref}$, offset by a temperature correction voltage proportional to the offset current. Each of these subcircuits is more fully described below.

In the PTAT current source 32, a band gap reference voltage is applied to the base of transistor Q19 to forward bias the base-emitter junction. Emitter resistor R7 establishes a predetermined nominal current through Q19 and hence through transistor Q20. The current in transistor Q20 is reflected in transistors Q21 and Q1, due to the symmetry of the circuit, thereby biasing transistor Q1 ON.

The base terminal of transistor Q1 is held at a voltage level equal to the Q1 $V_{be}$ above circuit ground because the emitter terminal is coupled to ground. Transistor Q1 base terminal is coupled along a path 46 to the base terminals of transistors Q3, Q4, Q5 and Q6, all of which provide current sources for other circuits described below. A transistor Q2 may be included as shown to provide ample base drive current to transistors Q3–Q6. In some embodiments of the circuit, transistor Q2 may be unnecessary. In such embodiments, the collector and base terminals of transistor Q1 would be shorted together.

In operation, the Q19 base-emitter junction ON voltage $V_{be}$ will decrease as temperature increases. A decrease in $V_{be}$ of $Q_{19}$ increases the current flow in R7 and hence, in transistors Q20, Q21 and Q1. Because the base terminals and the emitter terminals of transistors Q1 and Q3–Q6 are common, all of them provide PTAT current sources that track the current in transistor Q19.

Transistor Q11 is coupled to the PTAT current source 32 via transistors Q3 and Q7–Q10 so that the current in transistor Q11 is proportional to the current in transistor Q19. The PTAT current $I_1$ is the collector current in transistor Q11.

The temperature stable current source 34 comprises transistors Q3, Q7–Q10 and Q12 and a temperature stable, adjustable resistor R1. Transistors Q7 and Q8 form a differential pair having their emitters connected to current source Q3. A band gap voltage source is coupled to the base of transistor Q7. The band gap voltage is stable over temperature. The band gap voltage appears also at the base of transistor Q8.

The emitter terminal of transistor Q12 is coupled to the base of Q8 and coupled to ground through resistor R1. In operation, because the Q12 emitter voltage is fixed, the current through transistor Q2 is essentially determined by the value of resistor R1. Thus, the Q12 collector current $I_2$ is a temperature stable, adjustable current. It may be observed that the offset current $I_2 - I_1$, the circuit being in an operational state, will flow along a path 40.

Resistor R1 may be a fixed resistor. It is advantageous, however, to provide for adjusting R1, at least at the time of manufacturing the circuit, in order to precisely tune the VCO to a desired frequency under a predetermined set of operating conditions. Such an adjustment may be used to compensate for component and process variations. R1 may be implemented by a laser-trimmed resistor or a conventional potentiometer. Where the compensation circuit 10 is otherwise implemented on an integrated circuit chip, resistor R1 may be either on the chip or external.

The reference voltage source circuitry 42 includes transistors Q13 and Q14. The reference voltage $V_{ref}$ is maintained approximately 1 $V_{be}$ below $V_{cc}$, due to the junction drop in transistor Q13. As noted above, the control signal $V_{in}$ is relative to a control reference voltage. The reference voltage $V_{ref}$ is set equal to the control reference voltage. Preferably, the reference voltage source circuitry 42 is integrated on the same chip as the circuitry that provides the control reference voltage so that the two reference voltage sources track each other, i.e. they vary, for example with temperature, in the same manner so that the actual error voltage remains constant.

The amplifier 36 consists of transistors Q5, Q6, Q14, Q15, Q16, Q17 and Q18. These transistors form a differential amplifier in which the non-inverting input to the amplifier is at the base of transistor Q14, indicated by the symbol (+). The inverting input is at the base of transistor Q15, indicated by (−).

Within the amplifier, transistors Q14 and Q15 form a differential pair having its output at node 44. The gain of the differential pair is proportional to the values of R4/(R2 +R3). Node 44 is coupled to an output stage 38, consisting of transistors Q18 and Q6. Transistor Q6 biases transistor Q18 so that Q18 provides forward transconductance gain and output voltage swing almost to the power supply rails. In a preferred embodiment, the values of resistors R2–R4 are set to result in a fairly low gain in the differential pair, for example, less than 10, to improve stability in view of the ample voltage gain of the output stage 38. The tuning signal $V_{tune}$ appears at the output of amplifier 36 which is the collector of transistor Q18.

A feedback resistor $R_f$ is coupled between the amplifier 36 output $V_{tune}$ and the inverting input (−). The control signal $V_n$ is coupled to the inverting input through a resistor $R_n$. Also, path 40, discussed above, is connected to the inverting input. It may be recalled that, in operation, path 40 sinks the offset current ($I_2 - I_1$) The reference voltage Vref source is coupled to the non-inverting input (+).

In operation, the PTAT current source provides a PTAT current $I_1$ at the collector of Q11. A temperature stable current $I_2$ flows through Q12, so that the difference, the offset current $I_2 - I_1$, flows along path 40. Because the PTAT current is subtracted, the offset current is inversely related to temperature. As a result of the above topology, the tuning signal voltage $V_{tune} = (V_{ref} - V_n)*(R_f/R_n) + (I_2 - I_1)*R_f$. The first product of this expression reflects the level shifting of $V_n$ relative to $V_{ref}$ and the overall amplifier gain $R_f/R_n$, which preferably is set to unity. The second term of the expression reflects the temperature compensation offset voltage.

Because the offset current decreases as temperature increases, the tuning voltage also decreases, for a constant $V_{in}$. A decrease in voltage $V_{tune}$ increases the reverse bias voltage on the varactor $D_{vco}$ because the varactor is biased from $V_{cc}$. An increase in the reverse bias voltage reduces the varactor capacitance, thereby compensating for the capacitance temperature drift. In a circuit where the varactor is biased from ground, the same principles apply, and circuit may be modified as will be obvious to those skilled in the art to provide compensation in the appropriate direction.

Having illustrated and described the principles of my invention in a preferred embodiment thereof, it should be readily apparent to those skilled in the art that the invention can be modified in arrangement and detail without departing from such principles. For example, this invention could be applied to varactor controlled filters. I claim all modifications coming within the spirit and scope of the accompanying claims.

I claim:

1. A method of temperature compensating a voltage-controlled varactor oscillator which oscillates at a frequency proportional to a control signal voltage, said varactor oscillator having a predetermined temperature drift, the method comprising:
   generating said control signal voltage, the magnitude of which is proportional to a desired frequency of oscillation,
   providing a temperature dependent current;
   offsetting said control signal voltage by an amount proportional to said temperature dependent current to form a tuning signal having a temperature dependent voltage; and
   varying said temperature dependent current in response to temperature so that said tuning signal voltage varies to compensate for said oscillator temperature drift
   said step of providing a temperature dependent current including:
   providing a PTAT current proportional to temperature;
   providing a temperature stable current; and
   subtracting the PTAT current from the temperature stable current to form an offset current, whereby said offset current is inversely proportional to temperature.

2. A method according to claim 1, wherein said temperature stable current is adjustable, including the step of adjusting said temperature stable current to tune said oscillator to a predetermined frequency under a predetermined set of operating conditions.

3. A method according to claim 1 including providing a power supply voltage and amplifying said tuning signal such that said tuning signal has a voltage swing substantially equal to said power supply voltage.

4. A method according to claim 1 further comprising the steps of:
   providing a temperature stable voltage source;
   providing a circuit ground;
   providng an NPN bipolar transistor having a base terminal, an emitter terminal and a collector terminal; coupling the emitter terminal to said circuit ground through a predetermined resistance:
   coupling the voltage source to said base terminal to forward bias said transistor and thereby induce a temperature dependent collector current; and
   mirroring said collector current to provide said temperature dependent current.

5. A circuit for adjusting a varactor control signal voltage to compensate for the capacitance temperature drift of a varactor, the circuit comprising:
   input means for receiving the control signal;
   a temperature dependent current source for providing a temperature dependent current having a temperature drift proportional to said varactor capacitance temperature drift;
   means for converting said temperature dependent current to an offset signal having a voltage proportional to said temperature dependent current;
   means for combining said control signal and said offset signal to form a tuning signal; and
   means for coupling said tuning signal to said varactor so as to reverse bias said varactor in accordance with said control signal while compensating for said varactor capacitance temperature drift.

6. A circuit according to claim 5 wherein said temperature dependent current source includes:
   means for providing a temperature stable voltage signal;
   a transistor device forward biased by said stable voltage signal so as to provide a PTAT current; and
   means for mirroring said PTAT current to provide a current proportional to the PTAT current.

7. A circuit according to claim 5 further comprising a reference voltage source for providing a predetermined reference voltage; and amplifier means including means for shifting said control signal voltage by an amount equal to the reference voltage whereby the tuning signal voltage is proportional to the difference between the reference signal voltage and the control signal voltage, offset by the offset voltage.

8. A circuit according to claim 5 wherein said temperature stable current source is adjustable to allow adjusting the varactor capacitance under a predetermined set of operating conditions.

9. A circuit according to claim 5 wherein:
   said temperature dependent current source includes a PTAT current source for providing a PTAT current and an adjustable, temperature stable current source for providing a temperature stable current; and
   amplifier means including means for combining the PTAT current and the temperature stable current so that the offset signal voltage is proportional to the PTAT current less the temperature stable current.

10. A bipolar integrated circuit for temperature compensated control of a varactor voltage-controlled oscillator, said integrated circuit comprising:
    input means for receiving a control signal having a voltage related to a predetermined reference voltage;
    a band gap voltage source for providing a temperature stable voltage;
    a transistor current source coupled to said band gap voltage source to provide a PTAT current source for providing a PTAT temperature dependent current;
    a reference voltage source for providing said predetermined reference voltage;
    a differential amplifier having an inverting input node, a non-inverting input node and an output node;
    an input resistor coupled between said input means and said inverting input node;
    the reference voltage source being coupled to said non-inverting input node;
    the PTAT current source being coupled to said inverting input node;
    a feedback resistor coupled between said output node and said inverting input node to set a predetermined gain of said amplifier; and
    output means for coupling said output node to said oscillator to provide a tuning signal;
    whereby, said tuning signal is proportional to said control signal voltage, shifted by said reference voltage, and is offset by a temperature dependent voltage proportional to said temperature dependent current.

11. A circuit according to claim 10 further comprising a temperature stable current source coupled to the inverting input node for providing a stable current;
    whereby said temperature dependent voltage is proportional to a difference between said temperature dependent current and said stable current.

12. A circuit according to claim 11 wherein said temperature stable current source is adjustable for adjusting the temperature stable current to tune the oscillator.

* * * * *